United States Patent [19]
Jang

[11] Patent Number: 5,397,733
[45] Date of Patent: Mar. 14, 1995

[54] METHOD FOR THE CONSTRUCTION OF FIELD OXIDE FILM IN SEMICONDUCTOR DEVICE

[75] Inventor: Se A. Jang, Bubaleub, Ichonkun, Rep. of Korea

[73] Assignee: Hyundai Electronics Industries Co., Ltd., Rep. of Korea

[21] Appl. No.: 247,142

[22] Filed: May 20, 1994

[30] Foreign Application Priority Data

May 21, 1993 [KR] Rep. of Korea .................. 1993-8835

[51] Int. Cl.6 ............................................ H01L 21/76
[52] U.S. Cl. ........................................ 437/69; 437/70; 437/72; 437/73; 257/509
[58] Field of Search .................. 437/69, 70, 72, 73; 257/509

[56] References Cited

U.S. PATENT DOCUMENTS

| | | | |
|---|---|---|---|
| 4,755,477 | 7/1988 | Chao | 437/73 |
| 4,829,019 | 5/1989 | Mitchell et al. | 437/69 |
| 4,897,364 | 1/1990 | Nguyen et al. | 437/69 |
| 5,137,843 | 8/1992 | Kim et al. | 437/70 |
| 5,173,444 | 12/1992 | Kawamura | 437/69 |
| 5,196,367 | 3/1993 | Lu et al. | 437/69 |
| 5,246,537 | 9/1993 | Cooper et al. | 437/69 |
| 5,252,511 | 10/1993 | Bhan et al. | 437/72 |
| 5,256,895 | 10/1993 | Bryant et al. | 437/73 |
| 5,294,563 | 3/1994 | Rao | 437/70 |

FOREIGN PATENT DOCUMENTS

| | | | |
|---|---|---|---|
| 0100944 | 5/1986 | Japan | 437/69 |
| 0214536 | 9/1986 | Japan | 437/69 |
| 0214537 | 9/1986 | Japan | 437/69 |
| 0076654 | 4/1987 | Japan | 437/69 |
| 0145833 | 6/1987 | Japan | 437/72 |
| 0229960 | 10/1987 | Japan | 437/72 |
| 0090150 | 4/1988 | Japan | 437/69 |
| 0136548 | 6/1988 | Japan | 437/69 |
| 0051636 | 2/1989 | Japan | 437/69 |
| 0256155 | 10/1989 | Japan | 437/69 |
| 0072624 | 3/1992 | Japan | 437/69 |
| 0036676 | 2/1993 | Japan | 437/69 |

*Primary Examiner*—Tom Thomas
*Assistant Examiner*—Trung Dang
*Attorney, Agent, or Firm*—Merchant, Gould, Smith, Edell, Welter & Schmidt

[57] ABSTRACT

Methods for the construction of field oxide film is disclosed. The methods facilitates the control of the length and thickness of L-shaped spacer, overcoming some difficulties in processing a semiconductor device. Thus, the stresses and defects of semiconductor substrate can be greatly diminished. In addition, the methods bring about an effect of easily achieving the separation process of semiconductor device, an essential process. Superior in suppressing Bird's beak, the methods are capable of securing more large active region in a semiconductor device.

12 Claims, 15 Drawing Sheets

METHOD FOR THE CONSTRUCTION OF FIELD OXIDE FILM IN SEMICONDUCTOR DEVICE

BACKGROUND OF THE INVENTION

1. Field of the Invention

The present invention relates, in general, to methods for constructing a field oxide film which sections the substrate of semiconductor device into an active region and an device insulating field and, more particularly, to an improvement in securing more large active region along with the methods.

2. Description of the Prior Art

In the processes for manufacturing a semiconductor device, the construction of a field oxide film which divides the substrate into an active region and a field region is believed to be one of the most important processes to achieve a high degree of integration. In the construction, it is required to minimize the size of so-called "Bird's beak", to secure more large active region.

For better understanding of the background of the present invention, the description of a conventional method for constructing a field oxide film in a semiconductor device along with its problems is given next, with reference to FIGS. 1A through 1D showing the use of L-shaped spacer.

Figure 1A:
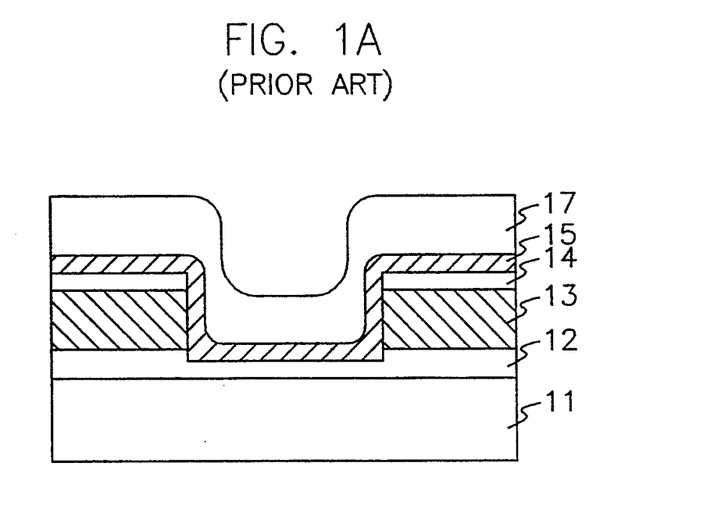
FIGS. 1A through 1D are schematic, cross sectional views illustrating a conventional method for constructing a field oxide film by use of L-shaped spacers.

First, as illustrated in FIG. 1A, over a silicon substrate 11, there is formed a pad oxide film 12 on which a nitride film 13 and a first chemical vapor deposition (hereinafter referred to as "CVD") oxide film 14 are subsequently formed, in due order, and then, a selective etch process is undertaken to remove a predetermined portion of the first CVD oxide film 14 and nitride film 13, so as to form a field region. This figure further illustrates that a second nitride film 15 is formed on the resulting structure, followed by the formation of a second CVD oxide film 17 over the second nitride film 15. From these two second films, spacers are to be formed later.

Figure 1B:
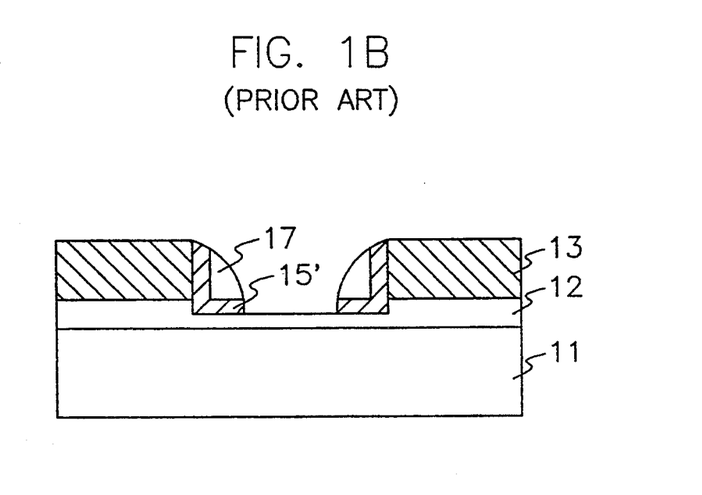

Next, not until the pad oxide film 17 is exposed are the second CVD oxide film 17 and the second nitride film 15 subjected to etching, so that a pair of spacers are formed, as illustrated in FIG. 1B.

Figure 1C:
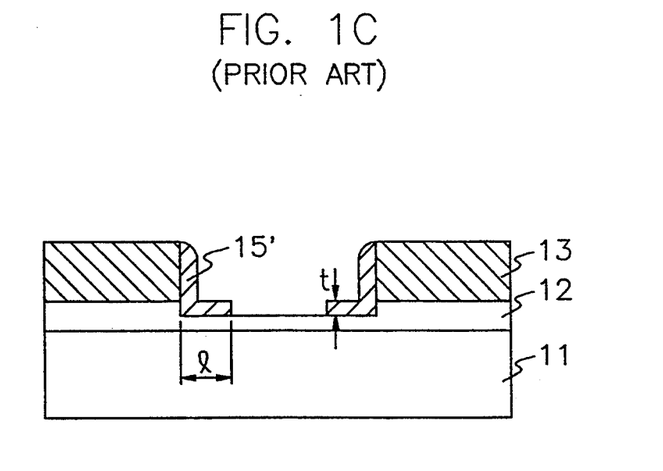

Thereafter, wet etching is applied to the spacers, to remove fragments of the second CVD oxide film left on the arms of the spacers, as illustrated in FIG. 1C. As a result, a pair of L-shaped spacers 15' of the second nitride film are formed.

Figure 1D:
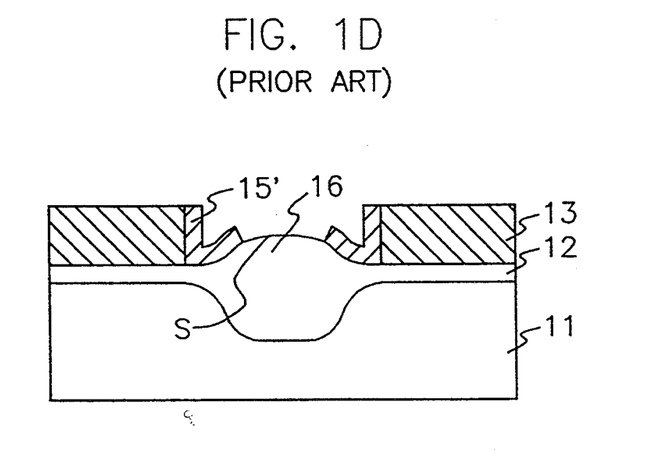

Finally, a field oxide film 16 is formed by, for example, oxidation, as illustrated in FIG. 1D.

As inferred from the illustrated conventional method, the L-shaped spacer 15 shown in FIG. 1C dominates the subsequent growth of the field oxide film. In detail, the arm length of the L-shaped spacer 15' which is designated by reference letter l in FIG. 1C determines the area in which the silicon substrate 11 is oxidized when the field oxide film is formed. In the meanwhile, the thickness of the arm of the L-shaped spacer 15' which is designated by reference letter t dominates the shape of the surface s of the field oxide film formed. For example, if the thickness t is too large, Bird's beak comes to be shortened whereas the surface gets impressions pressed by the arms of the L-shaped spacers 15.

Accordingly, the conventional method for the construction of field oxide film is problematic in its processing steps and in controlling the thickness and the length. For example, controlling the thickness and length of the spacer always requires a precise control of the thicknesses of the oxide film and the nitride film both of which have been formed before the formation of the spacer.

SUMMARY OF THE INVENTION

Therefore, an object of the present invention is to overcome the above problems encountered in prior arts and to provide methods for the construction of field oxide film in a semiconductor device, capable of diminishing the Bird's beak and securing large active region.

In accordance with an aspect of the present invention, there is provided a method for the construction of field oxide film in a semiconductor device, comprising the steps: forming a nitride film over a pad oxide film overlaying a semiconductor substrate; etching a portion of the nitride film to a degree that the pad oxide film is not exposed, said nitride film coming to be left in a thickness in the portion; forming a polysilicon film over the resulting nitride film and applying spacer etch to a region included in the portion without a mask in such a way to remove the polysilicon film and the nitride film and to leave a thickness of the pad oxide film so as not to expose the semiconductor substrate; and removing the polysilicon film left after the spacer etch and forming a field oxide film.

In accordance with another aspect of the present invention, there is provided a method for the construction of field oxide film in a semiconductor device, comprising the steps of: forming a nitride film over a polysilicon film atop a pad oxide film overlaying a semiconductor substrate; etching a predetermined portion of the nitride film to a degree that the polysilicon film is not exposed, said nitride film coming to be left in a thickness in the portion; forming an oxide film over the resulting nitride film and applying spacer etch to a region included in the portion without a mask in such a way to remove the oxide film and the nitride film and to leave a thickness of the polysilicon film so as not to expose the pad oxide film; and removing the oxide film left after the spacer etch and forming a field oxide film by use of thermal oxidation.

In accordance with a further aspect of the present invention, there is provided a method for the construction of field oxide film in a semiconductor device, comprising the steps of: forming a nitride film over a pad oxide film atop a semiconductor substrate; etching a portion of the nitride film to a degree that the pad oxide film is not exposed, said nitride film coming to be left in a thickness in the portion; forming an oxide film over the resulting nitride film and applying spacer etch to a region included in the portion in such a way to remove the oxide film and the nitride film and to leave a thickness of the pad oxide film so as not to expose the semiconductor substrate; and performing wet etch to remove at once the oxide film left after said spacer etch and the pad oxide exposed and forming a field oxide film.

In accordance with still another aspect of the present invention, there is provided a method for the construction of field oxide film in a semiconductor device, comprising the steps of: forming a pad oxide film, a first nitride film, a polysilicon film and a second nitride film over a semiconductor substrate, in due order; etching a portion of the second nitride film and polysilicon film, so as to expose the first nitride film; forming an oxide film over the resulting structure and applying spacer etch to a region included in the portion to remove the oxide film and the first nitride film so as to expose the pad oxide film; removing at once the oxide film left after said spacer etch and the exposed pad oxide and forming a field oxide film.

In accordance with still a further aspect of the present invention, there is provided a method for the construction of field oxide film in a semiconductor device, comprising the steps of: forming a pad oxide film, a first nitride film, a first oxide film and a second nitride film over a semiconductor substrate, in due order; etching a portion of the second nitride film, so as to expose the first oxide film and forming a second oxide film over the resulting structure; applying spacer etch to a region included in the portion to remove the second oxide film, the first oxide film, and the first nitride film, in due order; removing at once the second oxide film left after said spacer etch and the exposed pad oxide and forming a field oxide film.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENTS

Hereinafter, the preferred embodiments of the present invention are described with reference to the accompanying drawings.

Referring initially to FIGS. 2A through 2E, there is illustrated a first embodiment according to the present.

Figure 2A:
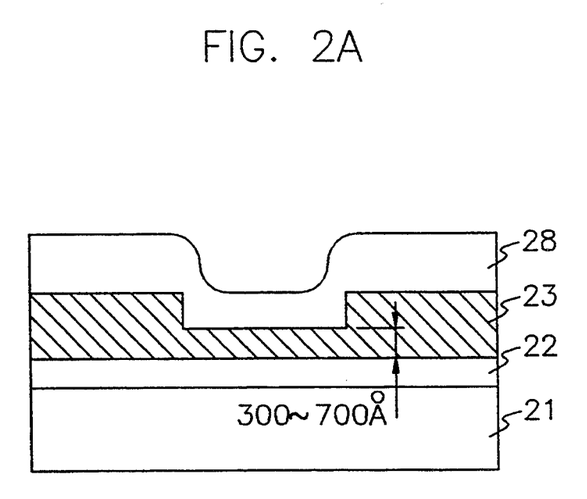
FIGS. 2A through 2E are schematic, cross sectional views illustrating a method for constructing a field oxide film by use of L-shaped spacers, according to a first embodiment of the present invention.

First, as illustrated in FIG. 2A, over a silicon substrate, there is formed a pad oxide film 22 with a thickness of approximately 200 to approximately 300 Å which is then covered with a nitride film 23 with a thickness of approximately 1,000 to approximately 2,000 Å which, in turn, is subjected to etching to remove a predetermined portion thereof in such a way to attenuate the predetermined portion into approximately 300 to approximately 700 Å. FIG. 2A also shows a polysilicon film 28 which is deposited entirely on the resulting nitride film 23 including the attenuated portion in thicknesses ranging from approximately 300 to 1,000 Å. By the way, while the approximately 300 to approximately 700 Å portion of the nitride film 23 determines the thickness of an arm of an L-shaped spacer to be formed at subsequent steps, the deposition thickness of the polysilicon film 28 dominates the length of the arm.

Figure 2B:
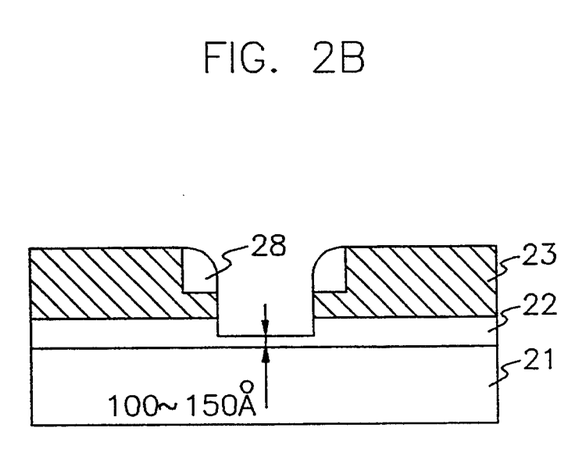

Next, as illustrated in FIG. 2B, a spacer etch process is performed without using a mask, to selectively remove the polysilicon film 28, the nitride film 23 and the pad oxide film 22 all of which are included in the predetermined portion, until the etched portion of the pad oxide film 22 comes to be thinned into a thickness of approximately 100 approximately 150 Å.

Figure 2C:
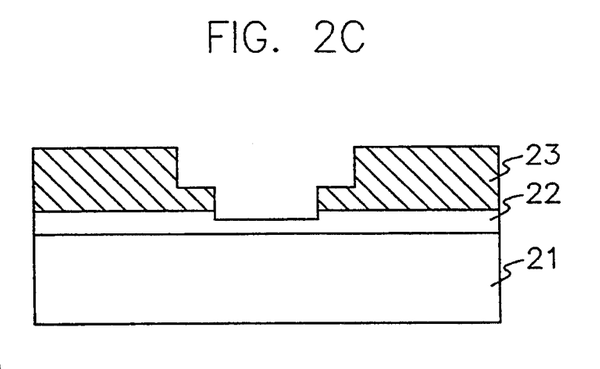

Following this, as illustrated in FIG. 2C, fragments of the polysilicon film 28 which are left on the arms are removed, so that L-shaped spacers are definitely revealed.

Figure 2D:
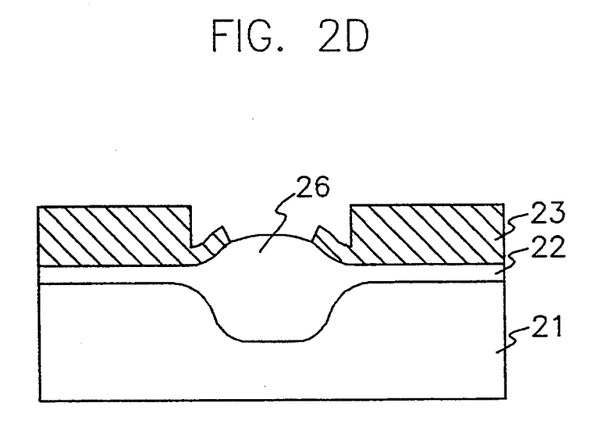

Thereafter, as illustrated in FIG. 2D, thermal oxidation is applied, to form a field oxide film 26.

Figure 2E:
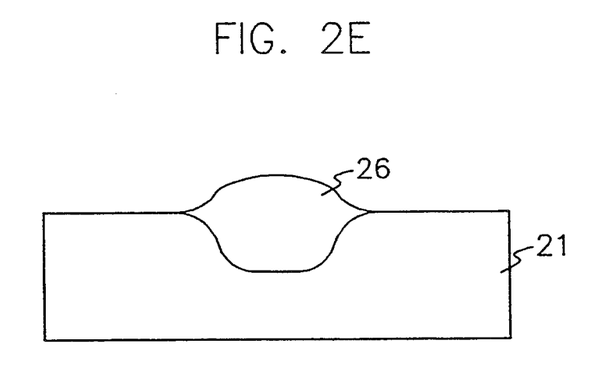

Finally, as illustrated in FIG. 2E, the nitride film 23 and the pad oxide film 22 are removed.

In the first embodiment of the present invention, the L-shaped spacers are formed with the nitride film itself, an oxidation protective film.

Referring now to FIGS. 3A through 3F, there is illustrated a second embodiment according to the present invention.

Figure 3A:
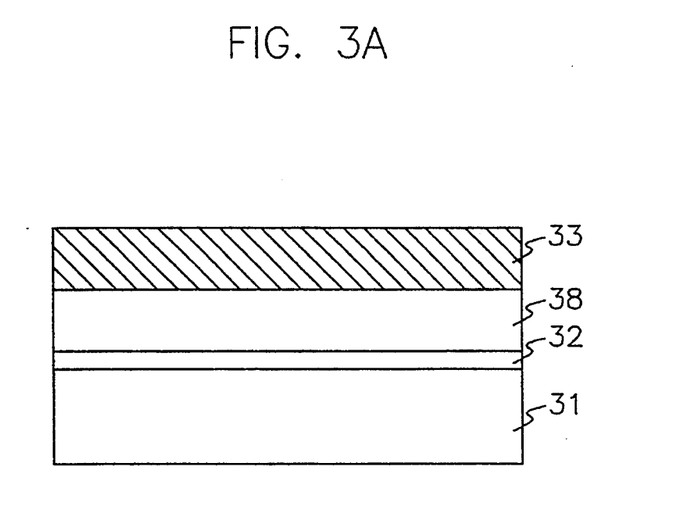
FIGS. 3A through 3F are schematic, cross sectional views illustrating a method for constructing a field oxide film by use of L-shaped spacers, according to a second embodiment of the present invention.

First, as illustrated in FIG. 3A, over a silicon substrate 31 is a pad oxide film 32 with a thickness of approximately 50 to approximately 200 Å formed which, in turn, is overlaid by a polysilicon film 38 which is approximately 200 to approximately 500 Å, and then, a nitride film 33 is formed over the polysilicon film 38 in a thickness of approximately 1,500 to approximately 3,000 Å.

Figure 3B:
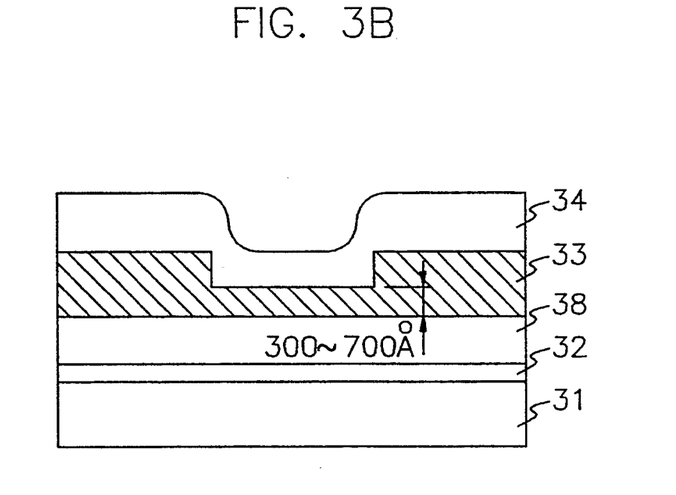

Next, as illustrated in FIG. 3B, a predetermined portion of the nitride film 33 is subjected to etching in such a way to attenuate the thickness of the predetermined portion into approximately 300 to approximately 700 Å, and then, a CVD oxide film with a thickness of approximately 300 to approximately 1,000 Å is formed entirely over the resulting nitride film 33 including the attenuated portion. By the way, while the approximately 300 to approximately 700 Å portion of the nitride film 33 determines the thickness of an arm of an L-shaped spacer to be formed at subsequent steps, the deposition thickness of the CVD oxide film 34 dominates the length of the arm.

Figure 3C:
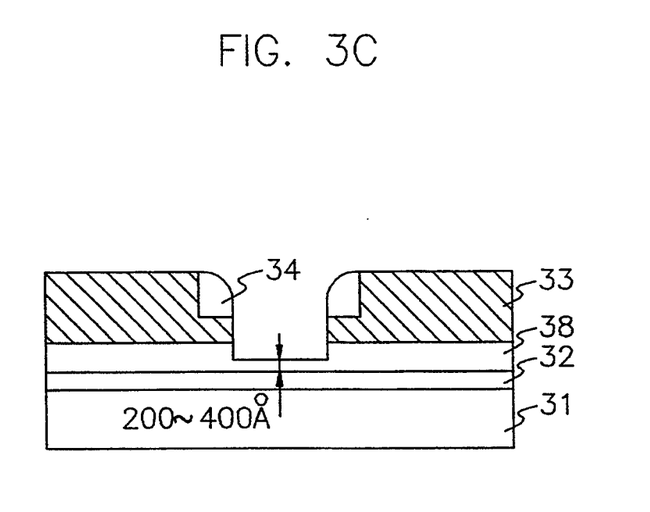

Subsequently, as illustrated in FIG. 3C, a spacer etch process is performed without using a mask, to selectively remove the CVD oxide film 34, the nitride film 33 and the polysilicon film 38 all of which are included in the predetermined portion, until the etched portion of the polysilicon film 38 comes to be thinned into a thickness of approximately 100 approximately 150 Å.

Figure 3D:
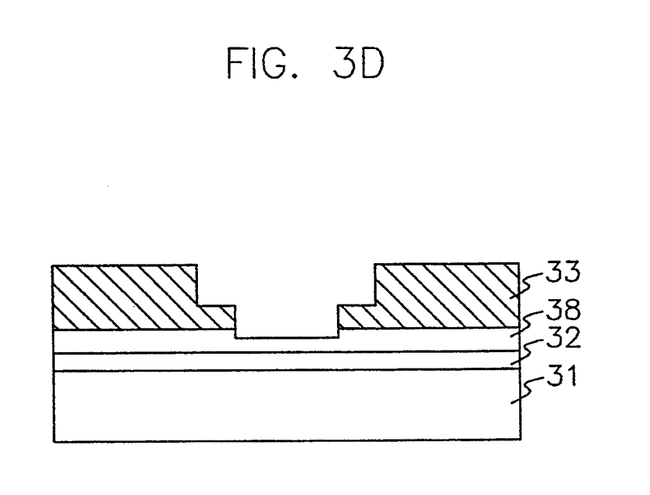

Following this, as illustrated in FIG. 3D, fragments of the polysilicon film 34 which are left on the arms are removed, so that L-shaped spacers are definitely revealed.

Figure 3E:
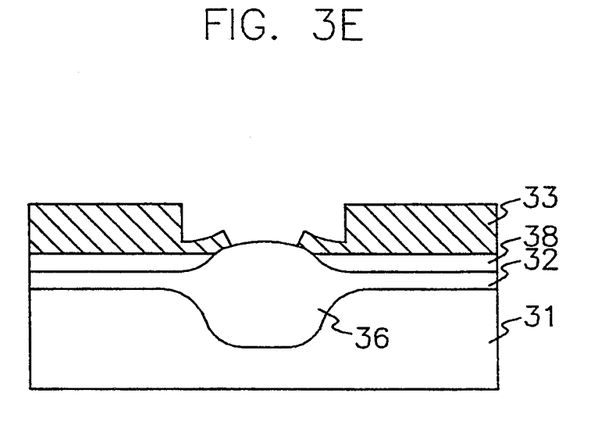
Figure 3F:
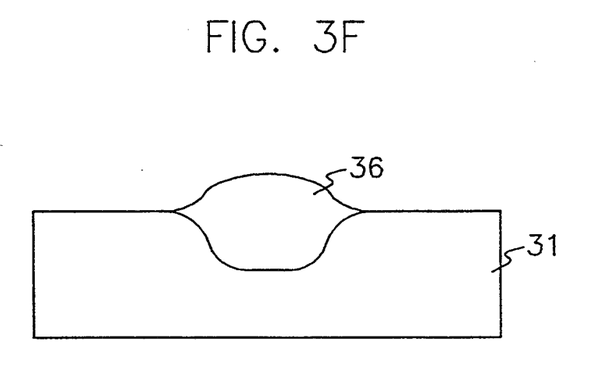

Thereafter, as illustrated in FIG. 3E, thermal oxidation is applied, to form a field oxide film 36.

Finally, as illustrated in FIG. 2E, the nitride film 33, the polysilicon film 38 and the pad oxide film 22 left are removed, thereby completing the formation of field oxide film 36.

Like the first embodiment above, the second embodiment of the present invention is to form L-shaped spacers consisting of a single film, and, however, advanced in that the bird's beak is diminished by further forming the polysilicon film on the pad oxide film.

Referring to FIGS. 4A through 4E, there is illustrated a third embodiment of the present invention.

Figure 4A:
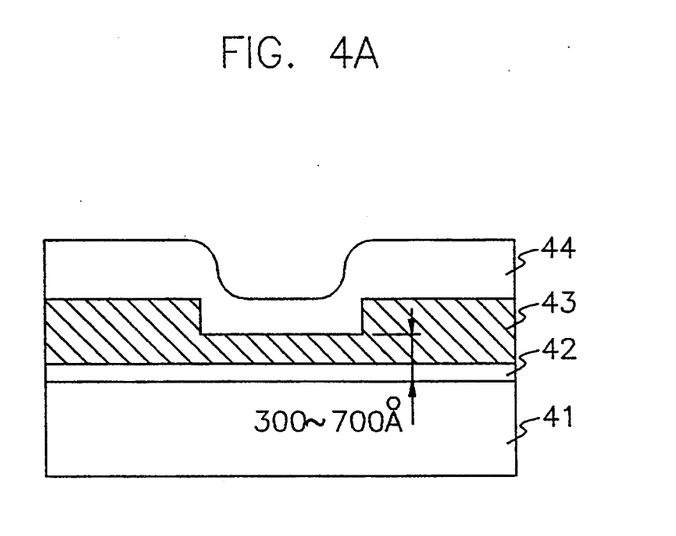
FIGS. 4A through 4E are schematic, cross sectional views illustrating a method for constructing a field oxide film by use of L-shaped spacers, according to a third embodiment of the present invention.

First, as illustrated in FIG. 4A, over a silicon substrate 41, there is formed a pad oxide film 42 with a thickness of approximately 200 to approximately 300 Å which is then covered with a nitride film 43 with a thickness of approximately 1,000 to approximately 2,000 Å which, in turn, is subjected to etching, to remove a predetermined portion thereof in such a way to attenuate the predetermined portion into approximately 300 to approximately 700 Å. FIG. 4A also shows a CVD oxide film 44 which is deposited entirely on the resulting nitride film 43 including the attenuated portion in thicknesses ranging from approximately 1,000 to 2,000 Å.

Figure 4B:
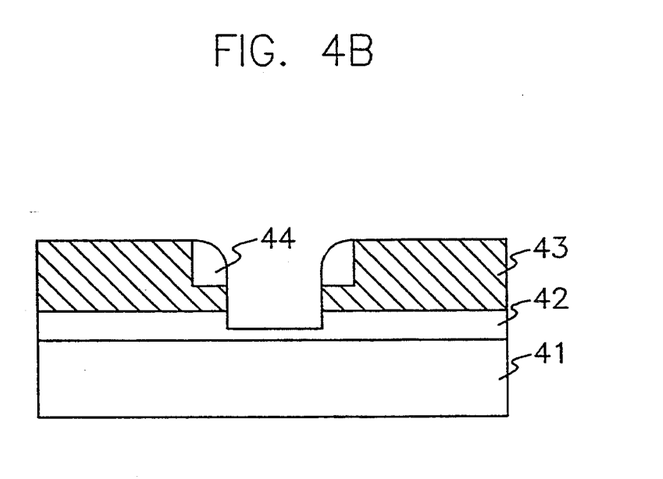

Following the formation of the CVD oxide film 44, as illustrated in FIG. 4B, a spacer etch process is undertaken without using a mask, so as to selectively remove the CVD oxide film 44, the nitride film 43 and the pad oxide film 42 all of which are included in the predetermined portion. In this process, the pad oxide film 44 is left approximately 100 approximately 150 Å thick so as not to expose the silicon substrate 41.

Figure 4C:
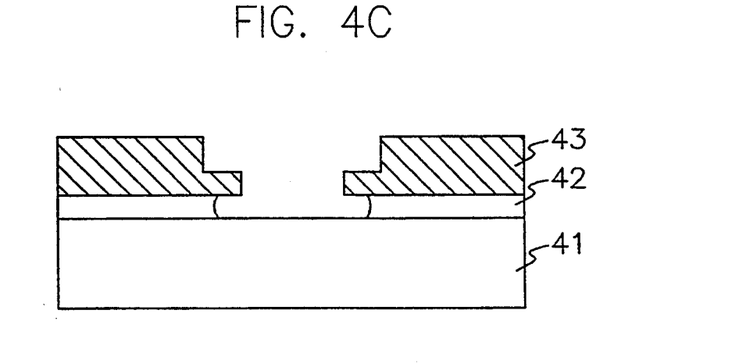

Next, as illustrated in FIG. 4C, a wet etching process is carried out, so as to remove not only fragments of the CVD oxide film 44 which are left on the arms and the thinned portion of the pad oxide film 44 but also a portion of the pad oxide film 44 which is present below each of the arms, so that L-shaped spacers are definitely revealed.

Figure 4D:
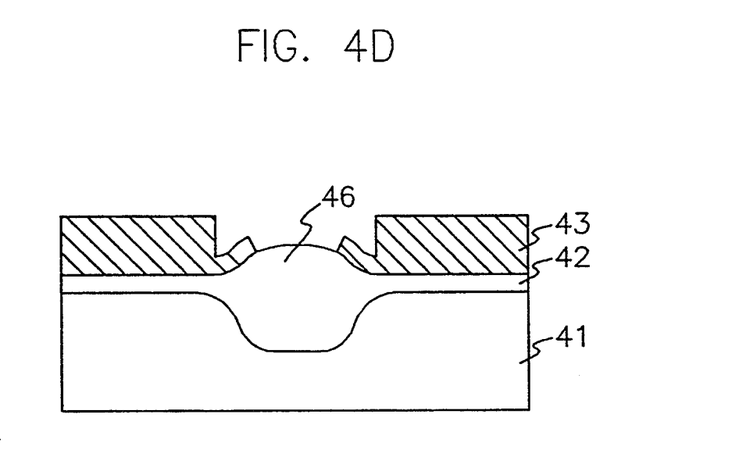

Thereafter, as illustrated in FIG. 4D, thermal oxidation is applied, to form a field oxide film 46.

Figure 4E:
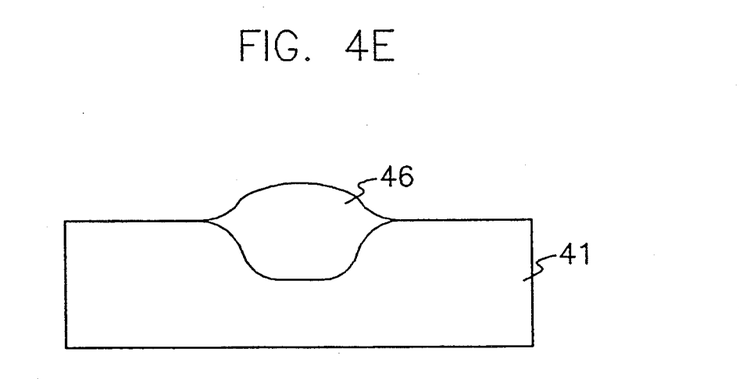

Finally, as illustrated in FIG. 4E, the nitride film 43 and the pad oxide film 42 are removed, thereby completing the formation of the field oxide film.

Turning now to FIGS. 5A through 5G, there is illustrated a fourth embodiment according to the present invention.

Figure 5A:
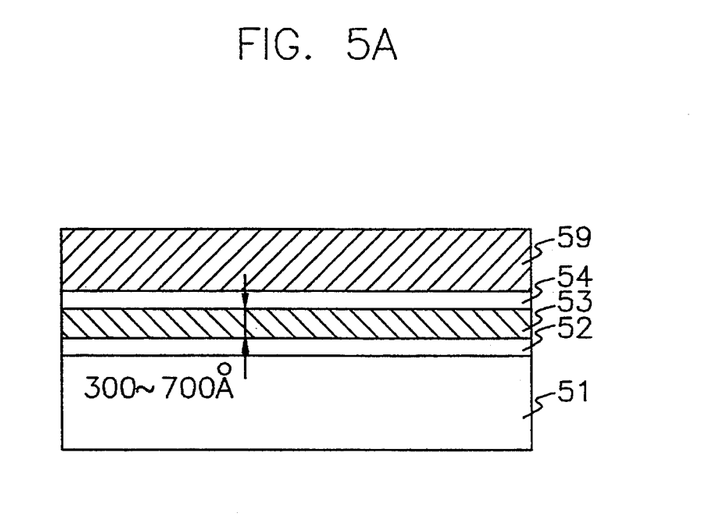
FIGS. 5A through 5G are schematic, cross sectional views illustrating a method for constructing a field oxide film by use of L-shaped spacers, according to a fourth embodiment of the present invention.

First, as illustrated in FIG. 5A, over a silicon substrate 51 is a pad oxide film 52 with a thickness of approximately 50 to approximately 150 Å formed which, in turn, is overlaid by a first nitride film 53 which is approximately 200 to approximately 500 Å thick, and then, the nitride film 53 is covered with a polysilicon film 54 with a thickness of approximately 200 to approximately 500 Å. This figure also shows a second nitride film 59 which is formed over the polysilicon film 54 in a thickness of approximately 1,000 to approximately 2,000 Å. By the way, the thickness of the first nitride film 53 atop the pad oxide film 52 determines the thickness of the arm of an L-shaped spacer which is to be formed through subsequent steps.

Figure 5B:
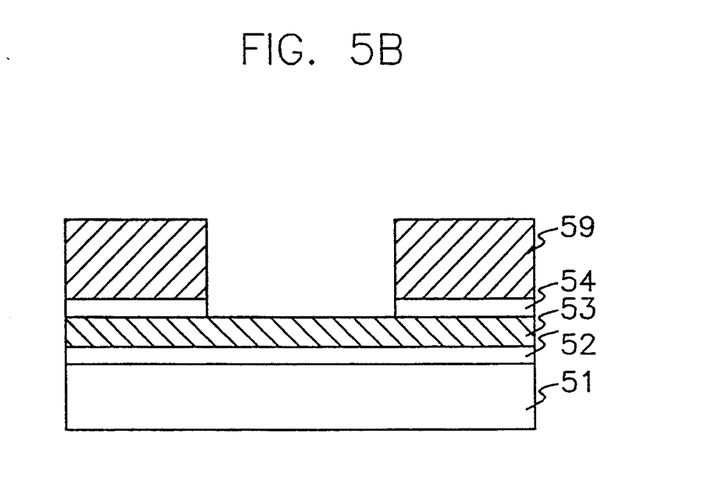

Next, as illustrated in FIG. 5B, a predetermined portion of the second nitride film 59, and polysilicon film 54 is subjected to etching, so as to expose the first nitride film 53 in part.

Figure 5C:
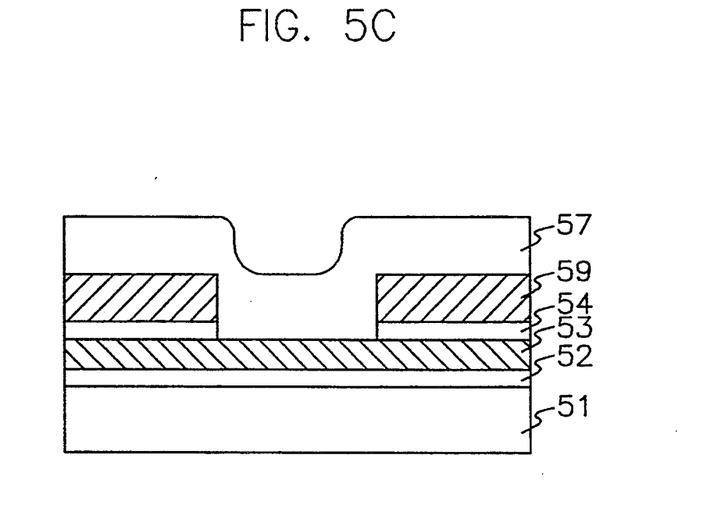

Following to the exposure, as illustrated in FIG. 5C, a CVD oxide film 57 is formed over the resulting structure in a thickness of approximately 1,000 to approximately 2,000 Å. This CVD oxide film 57 will determine the length of the arm of the L-shaped spacer.

Figure 5D:
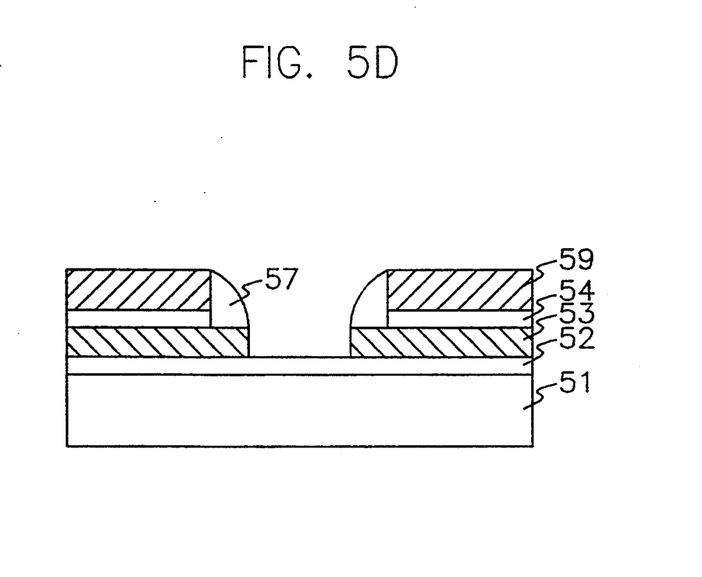

Subsequently, as illustrated in FIG. 5D, a spacer etch process is undertaken without using a mask, so as to selectively remove the CVD oxide film 57 and the nitride film 53 until the pad oxide film 52 is exposed.

Figure 5E:
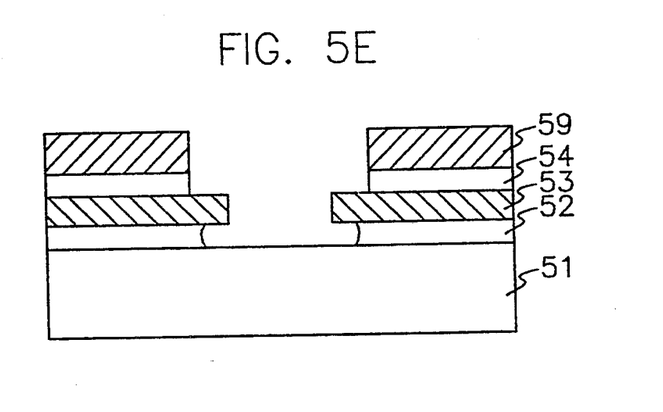

Thereafter, as illustrated in FIG. 5E, a wet etching process is carried out, so as to remove at once fragments of the CVD oxide film 44 which are left on the arms and the thinned portion of the pad oxide film 44. At this time, a portion of the pad oxide film 44 which is placed below each of the arms is removed due to the wet manner. As a result, L-shaped spacers are definitely revealed.

Figure 5F:
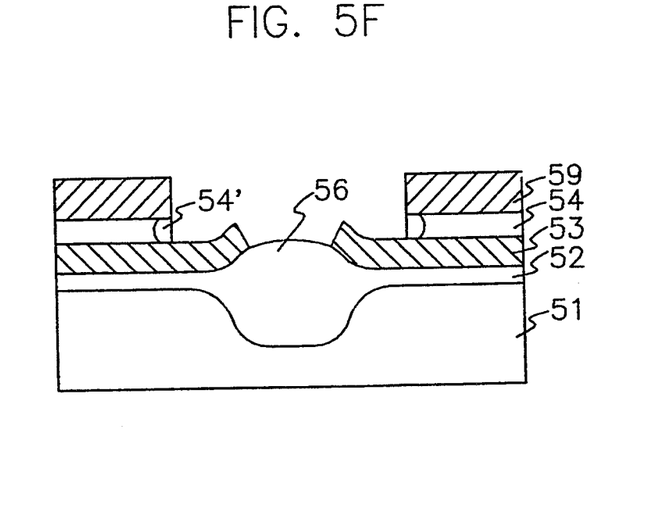

Then, as illustrated in FIG. 5F, thermal oxidation is applied, to form a field oxide film 56. On the application of thermal oxidation, each of the edge portions 54' of the etched polysilicon film 54 is swelled, pressing down the first nitride film 53 to effect the reduction of Bird's beak.

Figure 5G:
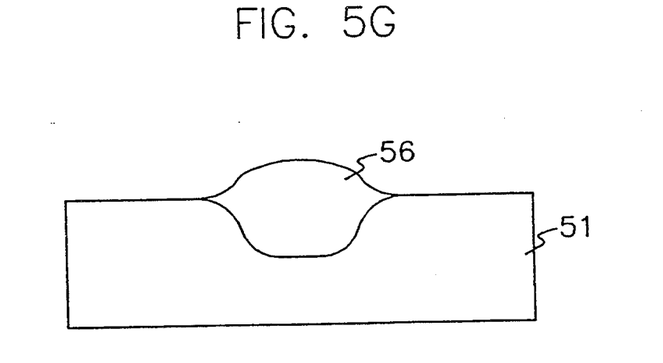

Finally, as illustrated in FIG. 5G, the first nitride film 53 and the pad oxide film 52 are removed, thereby completing the formation of the field oxide film.

Referring finally to FIGS. 6A through 6G, there is illustrated a fifth embodiment of the present invention.

Figure 6A:
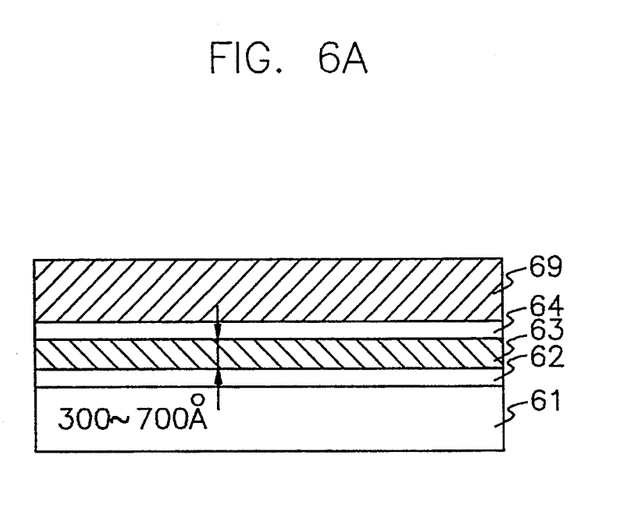
FIGS. 6A through 6G are schematic, cross sectional views illustrating a method for constructing a field oxide film by use of L-shaped spacers, according to a fifth embodiment of the present invention.

First, as illustrated in FIG. 6A, over a silicon substrate 61 is a buffer pad oxide film 62 with a thickness of approximately 50 to approximately 150 Å formed which, in turn, is overlaid by a first nitride film 63 which is approximately 300 to approximately 700 Å thick, and then, the nitride film 63 is covered with a buffer CVD oxide film 64 with a thickness of approximately 200 to approximately 500 Å. This figure also shows a second nitride film 69 which is formed over the buffer CVD oxide film 64 in a thickness of approximately 1,000 to approximately 2,000 Å. By the way, the thickness of the first nitride film 63 atop the buffer pad oxide film 62 determines the thickness of the arm of an L-shaped spacer which is to be formed through subsequent steps.

Figure 6B:
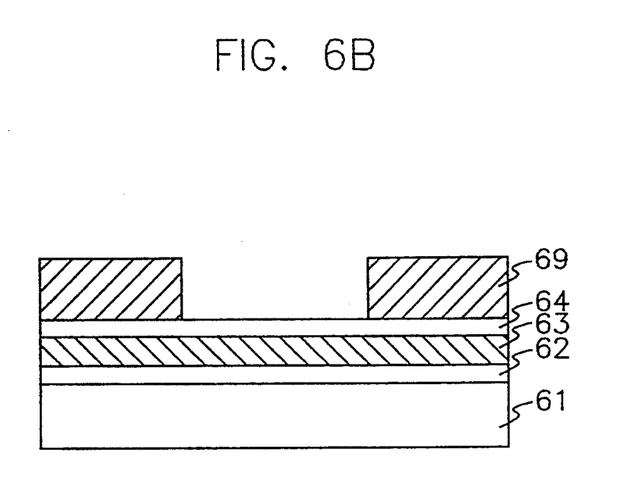

Next, as illustrated in FIG. 6B, a predetermined portion of the second nitride film 69 is subjected to etching, so as to expose the CVD oxide film 64.

Figure 6C:
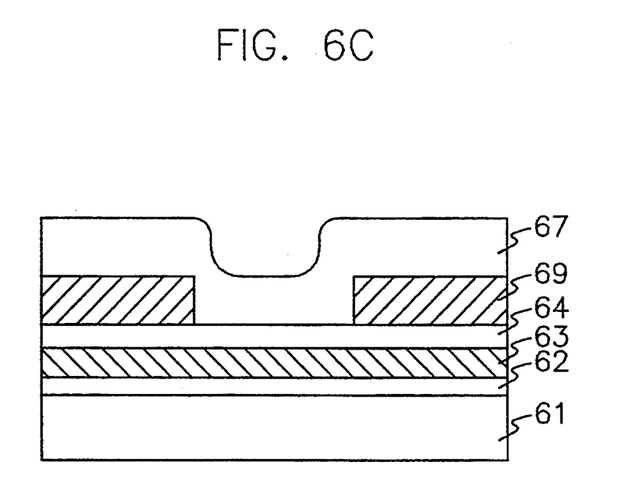

Following to the exposure, as illustrated in FIG. 6C, a second CVD oxide film 67 is formed over the resulting structure in a thickness of approximately 1,000 to approximately 2,000 Å.

Figure 6D:
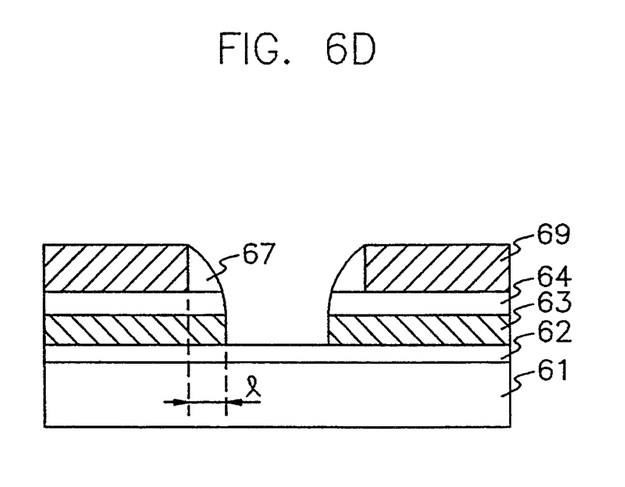

Subsequently, as illustrated in FIG. 6D, a spacer etch process is undertaken without using a mask, so as to selectively remove the second CVD oxide film 67, the first CVD oxide film 64 and the nitride film 63 all of which is included in the predetermined portion, until the pad oxide film 62 is exposed. At this time, the L-shaped spacers are formed the arm length of which can be adjusted by controlling the thickness of the second CVD oxide film 67.

Figure 6E:
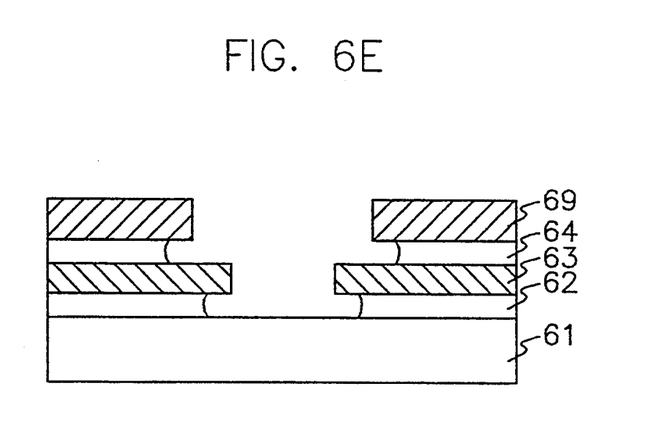

Thereafter, as illustrated in FIG. 6E, a wet etching process is carried out, so as to remove at once fragments of the second CVD oxide film 67 which are left on the arms and the exposed portion of the pad oxide film 62. At this time, a portion of the first pad oxide film 64 which is placed on each of the arm and a portion of the pad oxide film 62 below each of the arms are removed due to the wet manner. As a result, the arms are definitely protruded.

Figure 6F:
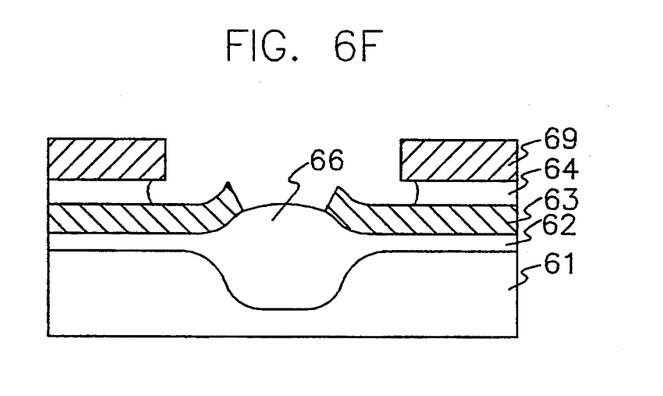

Then, as illustrated in FIG. 6F, thermal oxidation is applied, to form a field oxide film 56.

Figure 6G:
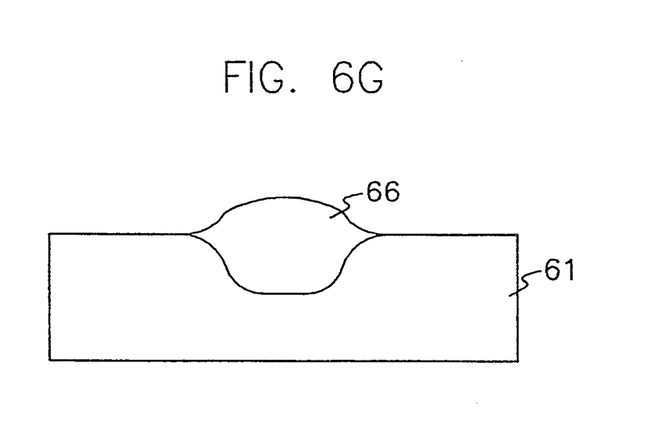

Finally, as illustrated in FIG. 6G, the second nitride film 69, the first CVD oxide film 64, the first nitride film 63 and the pad oxide film 62 which are left through the above processing steps are removed, thereby completing the construction of the field oxide film.

As described hereinbefore, the methods according to the present invention facilitates the control of the length and thickness of L-shaped spacer, overcoming some difficulties in processing a semiconductor device. Thus, in accordance with the present invention, the stresses and defects of semiconductor substrate can be greatly diminished. In addition, the methods according to the present invention bring about an effect of easily achieving the separation process of semiconductor device, an essential process.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for the construction of field oxide film in a semiconductor device, comprising the steps:
   forming a nitride film over a pad oxide film overlaying a semiconductor substrate;
   etching a portion of the nitride film to a degree that the pad oxide film is not exposed, said nitride film coming to be left in a thickness in said portion;
   forming a polysilicon film over the resulting nitride film and applying spacer etch to a region included in said portion without a mask in such a way to remove the polysilicon film and the nitride film and to leave a thickness of the pad oxide film so as not to expose the semiconductor substrate; and
   removing the polysilicon film left after the spacer etch and forming a field oxide film.

2. A method for the construction of field oxide film according to claim 1, wherein said pad oxide film, said nitride film, and said polysilicon film are formed in thicknesses ranging from approximately 200 to approximately 300 Å, from approximately 1,000 to approximately 2,000 Å, and from approximately 300 to approximately 1,000 Å, respectively.

3. A method for the construction of field oxide film according to claim 1, wherein said nitride film is left in a thickness of approximately 300 to approximately 700 Å in said portion.

4. A method for the construction of field oxide film according to claim 1, wherein said thickness of the pad oxide film left after the spacer etch is on the order of approximately 100 to approximately 150 Å.

5. A method for the construction of field oxide film in a semiconductor device, comprising the steps of:
   forming a nitride film over a polysilicon film atop a pad oxide film overlaying a semiconductor substrate;
   etching a portion of the nitride film to a degree that the polysilicon film is not exposed, said nitride film coming to be left in a thickness in said portion;
   forming an oxide film over the resulting nitride film and applying spacer etch to a region included in said portion without a mask in such a way to remove the oxide film and the nitride film and to leave a thickness of the polysilicon film so as not to expose the pad oxide film; and
   removing the oxide film left after the spacer etch and forming a field oxide film by use of thermal oxidation.

6. A method for the construction of field oxide film according to claim 5, wherein said polysilicon film is left in a thickness of approximately 200 to approximately 400 Å after said spacer etch.

7. A method for the construction of field oxide film in a semiconductor device, comprising the steps of:
   forming a nitride film over a pad oxide film atop a semiconductor substrate;
   etching a portion of the nitride film to a degree that the pad oxide film is not exposed, said nitride film coming to be left in a thickness in said portion;
   forming an oxide film over the resulting nitride film and applying spacer etch to a region included in said portion in such a way to remove the oxide film and the nitride film and to leave a thickness of the pad oxide film so as not to expose the semiconductor substrate; and
   performing wet etch to remove at once the oxide film left after said spacer etch and the pad oxide exposed and forming a field oxide film.

8. A method for the construction of field oxide film according to claim 7, wherein said pad oxide film, said nitride film, and said oxide film are formed in thicknesses ranging from approximately 200 to approximately 300 Å, from approximately 1,000 to approximately 2,000 Å, and from approximately 1,000 to approximately 2,000 Å, respectively.

9. A method for the construction of field oxide film according to claim 7, wherein said nitride film is left in a thickness of approximately 300 to approximately 700 Å in said portion.

10. A method for the construction of field oxide film in a semiconductor device, comprising the steps of:
    forming a pad oxide film, a first nitride film, a polysilicon film and a second nitride film over a semiconductor substrate, in due order;
    etching a portion of the second nitride film and polysilicon film, so as to expose the first nitride film;
    forming an oxide film over the resulting structure and applying spacer etch to a region included in said portion to remove the oxide film and the first nitride film so as to expose the pad oxide film;
    removing at once the oxide film left after said spacer etch and the exposed pad oxide and forming a field oxide film.

11. A method for the construction of field oxide film in a semiconductor device, comprising the steps of:
    forming a pad oxide film, a first nitride film, a first oxide film and a second nitride film over a semiconductor substrate, in due order;
    etching a portion of the second nitride film, so as to expose the first oxide film and forming a second oxide film over the resulting structure;
    applying spacer etch to a region included in said portion to remove the second oxide film, the first oxide film, and the first nitride film, in due order so as to expose the pad oxide film;
    removing at once the second oxide film left after said spacer etch and the exposed pad oxide and forming a field oxide film.

12. A method for the construction of field oxide film according to claim 11, wherein said first nitride film and said second nitride film are formed in thicknesses ranging from approximately 300 to approximately 700 Å and from approximately 1,000 to 2,000 Å, respectively.

* * * * *